(12) United States Patent
Jung et al.

(10) Patent No.: US 7,259,074 B2
(45) Date of Patent: Aug. 21, 2007

(54) TRENCH ISOLATION METHOD IN FLASH MEMORY DEVICE

(75) Inventors: Sung Mun Jung, Kyunggido (KR); Jum Soo Kim, Kyunggido (KR)

(73) Assignee: Dongbu Hitek Co., Ltd., Seoul (KR)

( * ) Notice: Subject to any disclaimer, the term of this patent is extended or adjusted under 35 U.S.C. 154(b) by 40 days.

(21) Appl. No.: 11/019,302

(22) Filed: Dec. 23, 2004

(65) Prior Publication Data
US 2005/0142745 A1 Jun. 30, 2005

(30) Foreign Application Priority Data
Dec. 27, 2003 (KR) ............... 10-2003-0098367

(51) Int. Cl.
*H01L 21/336* (2006.01)
*H01L 21/76* (2006.01)

(52) U.S. Cl. ............. 438/296; 438/424; 438/221; 438/425; 438/427; 438/430; 438/431; 438/429; 438/432

(58) Field of Classification Search ........ 438/424, 438/425, 426, 427, 428, 429, 430, 431, 221, 438/296, 359, 257, 432, 433, 434, 435, 436, 438/437, 438
See application file for complete search history.

(56) References Cited

U.S. PATENT DOCUMENTS 6,074,931 A * 6/2000 Chang et al. ............ 438/424
6,806,163 B2 * 10/2004 Wu et al. ................. 438/423
6,964,905 B2 * 11/2005 Inoue ...................... 438/296
6,974,755 B2 * 12/2005 Ko et al. .................. 438/424
2004/0106256 A1 * 6/2004 Dong et al. ............... 438/257

* cited by examiner

*Primary Examiner*—Walter Lindsay, Jr.
(74) *Attorney, Agent, or Firm*—Sherr & Nourse, PLLC

(57) ABSTRACT

The present invention provides a trench isolation method in a flash memory device, by which stability and reliability of the device are enhanced in a manner of forming a pad oxide layer thick in the vicinity of an edge of a trench isolation layer. The present invention includes forming a mask layer pattern on a semiconductor substrate to expose a device isolation area but to cover an active area thereof, the mask layer pattern comprising a first insulating layer pattern and a second insulating layer pattern stacked thereon, forming a trench in the semiconductor substrate corresponding to the device isolation area, removing an exposed portion of the first insulating layer pattern enough to expose a portion of the semiconductor substrate in the active area adjacent to the trench, forming a sidewall oxide layer on an inside of the trench and the exposed portion of the semiconductor substrate, filling up the trench with a third insulating layer to cover the sidewall oxide layer, and removing the mask layer pattern.

8 Claims, 3 Drawing Sheets

TRENCH ISOLATION METHOD IN FLASH MEMORY DEVICE

This application claims the benefit of the Korean Application No. P2003-0098367 filed on Dec. 27, 2003, which is hereby incorporated by reference.

BACKGROUND OF THE INVENTION

1. Field of the Invention

The present invention relates to a method of fabricating a semiconductor device, and more particularly, to a trench isolation method in a flash memory device.

2. Discussion of the Related Art

Lately, an isolated distance between devices becomes shorter than ever according to the tendency of high integration of a semiconductor device. For the device isolation impossible for the conventional LOCOS (local oxidation of silicon) to achieve, trench isolation is used worldwide. Trench isolation is a method of isolating devices from each other in a manner of forming a trench in a semiconductor substrate and filling the trench with insulator such as silicon oxide and the like. Trench isolation is applicable to a flash memory device. Yet, such a characteristic of the flash memory device as retention and cycling depends on a thinnest part of a tunnel oxide layer and a thickness of the tunnel oxide layer is affected by a trench isolation manner.

Specifically, trench isolation in a flash memory device is carried out in a following manner.

First of all, a pad oxide layer pattern, a nitride layer pattern, and a TEOS oxide layer pattern are stacked on a silicon substrate to configure a mask layer pattern.

An etch process is carried out on the silicon substrate using the mask layer pattern as an etch mask to remove an exposed portion of the silicon substrate, thereby forming a trench in the silicon substrate.

After oxidation has been carried out on a surface of the trench, a nitride layer liner is formed over the silicon substrate.

And, the trench is filled up with a high density plasma oxide layer.

The high density plasma oxide layer is planarized to expose a surface of the nitride layer pattern.

Finally, the nitride pattern and the pad oxide layer pattern are removed to complete a trench isolation layer, which is shown in FIG. 1.

Referring to FIG. 1, the trench 102 provided to a device isolation area of the silicon substrate 100 is filled up with the high density plasma oxide layer 104 that electrically isolates an active area of the silicon substrate 100.

After completion of the trench isolation, the pad oxide layer 106 is formed on the active area.

However, in the related art method, the pad oxide layer 106 is formed relatively thinner on an edge A of the trench isolation layer 104. Specifically, since an electric field is intensively focused on the edge A of the trench isolation layer 104, the uneven configuration of the pad oxide layer 106 degrades stability and reliability of the device.

SUMMARY OF THE INVENTION

Accordingly, the present invention is directed to a trench isolation method in a flash memory device that substantially obviates one or more problems due to limitations and disadvantages of the related art.

An object of the present invention is to provide a trench isolation method in a flash memory device, by which stability and reliability of the device are enhanced in a manner of forming a pad oxide layer thick in the vicinity of an edge of a trench isolation layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a trench isolation method in a flash memory device according to the present invention includes the steps of forming a mask layer pattern on a semiconductor substrate to expose a device isolation area but to cover an active area thereof, the mask layer pattern comprising a first insulating layer pattern and a second insulating layer pattern stacked thereon, forming a trench in the semiconductor substrate corresponding to the device isolation area, removing an exposed portion of the first insulating layer pattern enough to expose a portion of the semiconductor substrate in the active area adjacent to the trench, forming a sidewall oxide layer on an inside of the trench and the exposed portion of the semiconductor substrate, filling up the trench with a third insulating layer to cover the sidewall oxide layer, and removing the mask layer pattern.

Preferably, the first and second insulating layer patterns are formed of nitride and TEOS oxide, respectively.

Preferably, the exposed portion of the first insulating layer pattern is removed by wet etch using $H_3PO_4$.

Preferably, the exposed portion of the first insulating layer pattern is laterally removed to a thickness of 30~150 Å.

Preferably, the sidewall oxide layer is formed 100~300 Å thick.

Preferably, the third insulating layer is formed of high density plasma oxide.

Preferably, the mask layer pattern removing step includes the steps of planarizing the third insulating layer until a topside of the first insulating layer pattern is exposed and removing the first insulating layer pattern.

More preferably, the first insulating layer pattern is removed by wet etch.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2 to 6 are cross-sectional diagrams for explaining a method of forming a trench isolation layer in a flash memory device according to the present invention.

Figure 1:
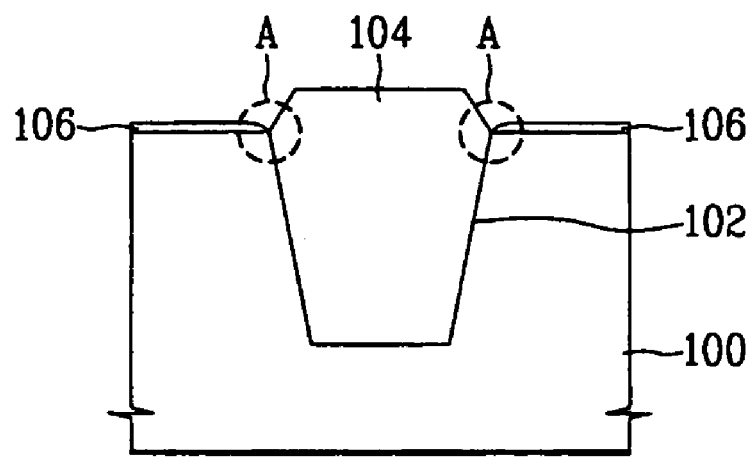
FIG. 1 is a cross-sectional diagram of a trench isolation layer in a flash memory device according to a related art.
Figure 2:
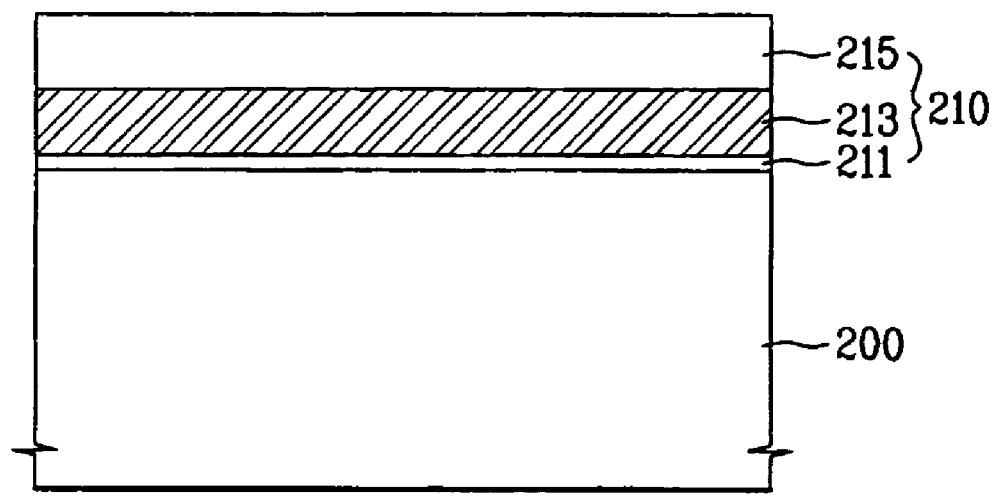
FIGS. 2 to 6 are cross-sectional diagrams for explaining a method of forming a trench isolation layer in a flash memory device according to the present invention.

Referring to FIG. 2, a pad oxide layer 211, a nitride layer 213, and a TEOS oxide layer 215 are sequentially stacked on a semiconductor substrate 200, e.g., silicon substrate to configure a mask layer 210. The mask layer 210 is provided for trench etch. Specifically, the nitride layer 213 will be used as an etch stop layer in per forming planarization later.

Figure 3:
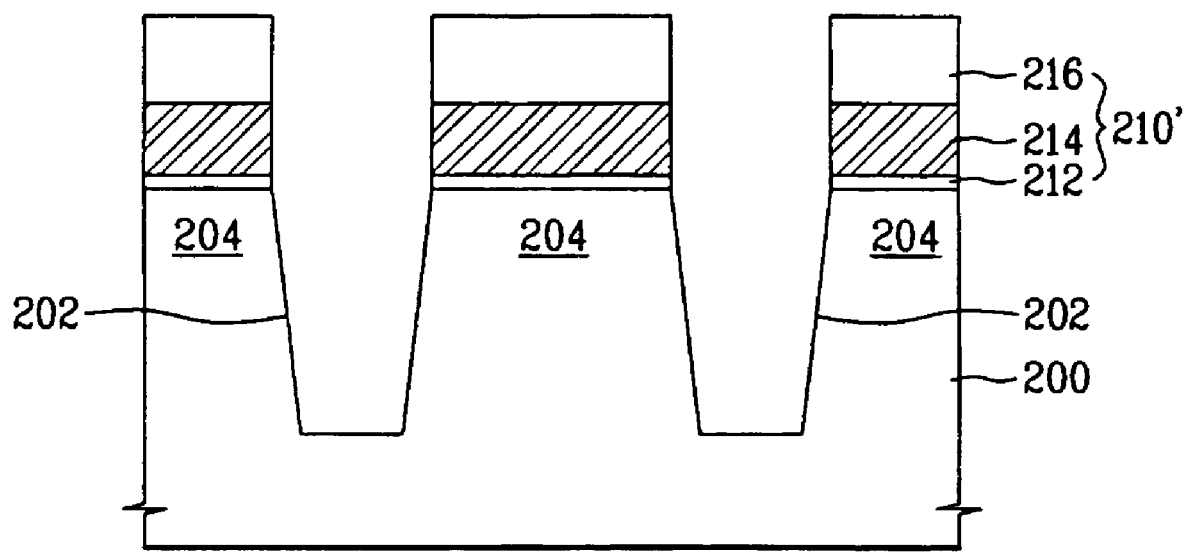

Referring to FIG. 3, a photoresist pattern (not shown in the drawing) is formed on the mask layer 210 in FIG. 2 to define a device isolation area over the silicon substrate 200.

The mask layer 210 is etched using the photoresist pattern as an etch mask to form a mask layer pattern 210' exposing the device isolation area of the substrate 212. The mask layer pattern 210' includes a pad oxide layer pattern 212, nitride layer pattern 214, and TEOS oxide layer pattern 216 sequentially stacked on an active area 204.

The substrate 212 corresponding to the exposed device isolation area is then etched to a predetermined depth using the mask layer pattern 210' as an etch mask. Hence, a trench 202 is formed in the device isolation area of the silicon substrate 200 to isolate the active area 204.

Figure 4:
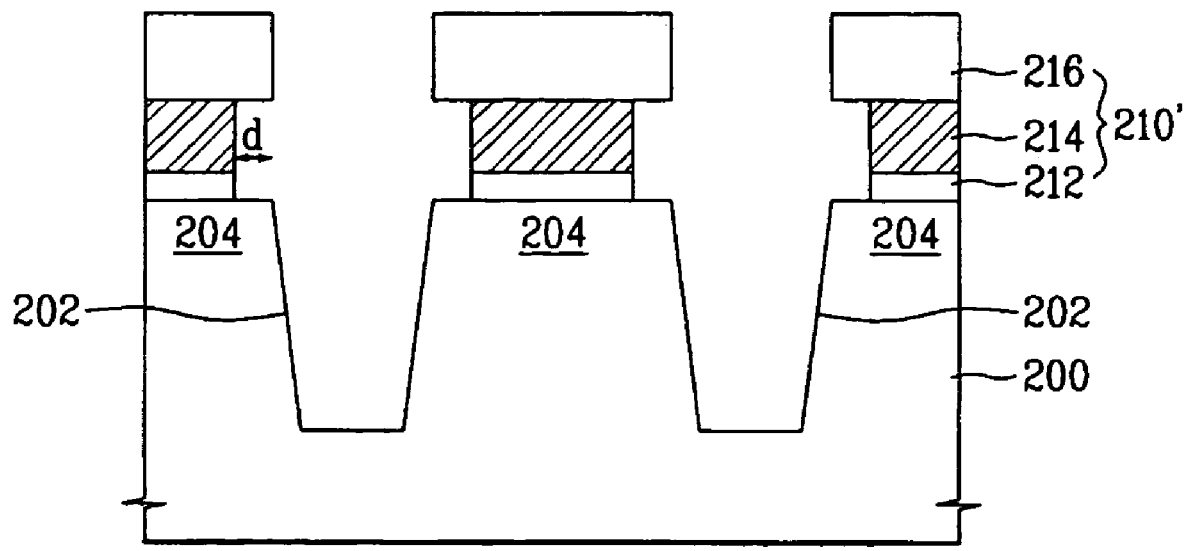

Referring to FIG. 4, the nitride layer pattern 214 and the pad oxide layer pattern 212 are removed by wet etch using $H_3PO_4$ as an etchant. Since a topside of the nitride layer pattern 214 is covered with the TEOS oxide layer pattern 216, the nitride layer pattern 214 and the pad oxide layer pattern 212 are partially removed. After completion of the wet etch, the nitride layer pattern 214 and the pad oxide layer pattern 212 decrease in width to expose a portion of the silicon substrate 200 in the active area 204 in part. In doing so, a width d of the removed nitride layer pattern 214 is set to 30~150 Å.

Figure 5:
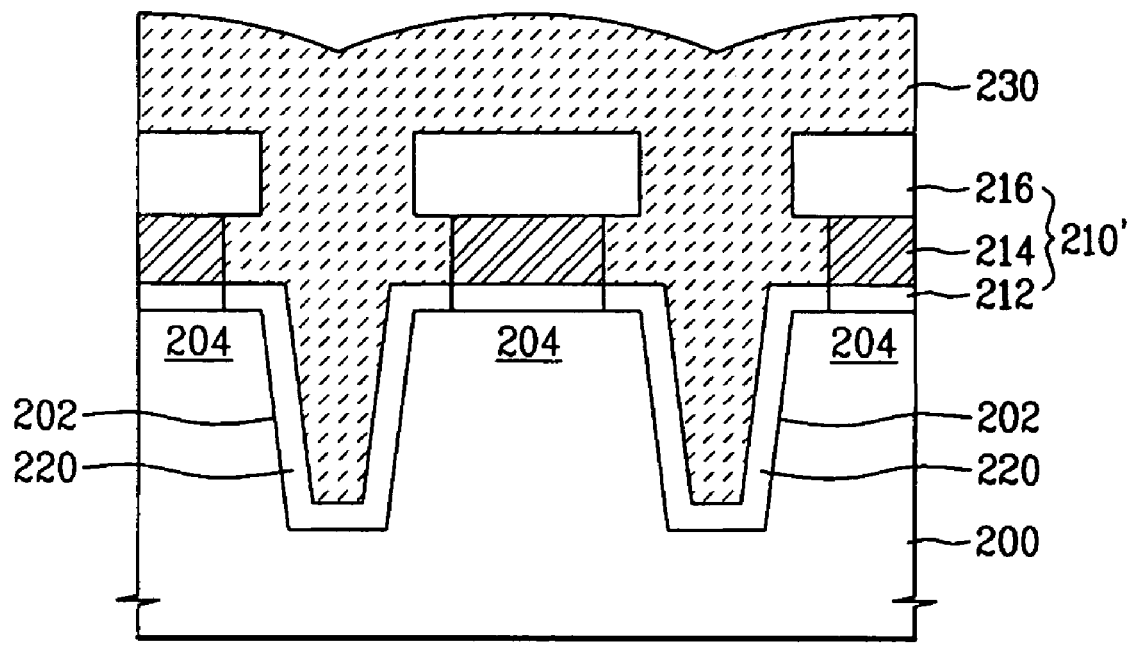
Figure 6:
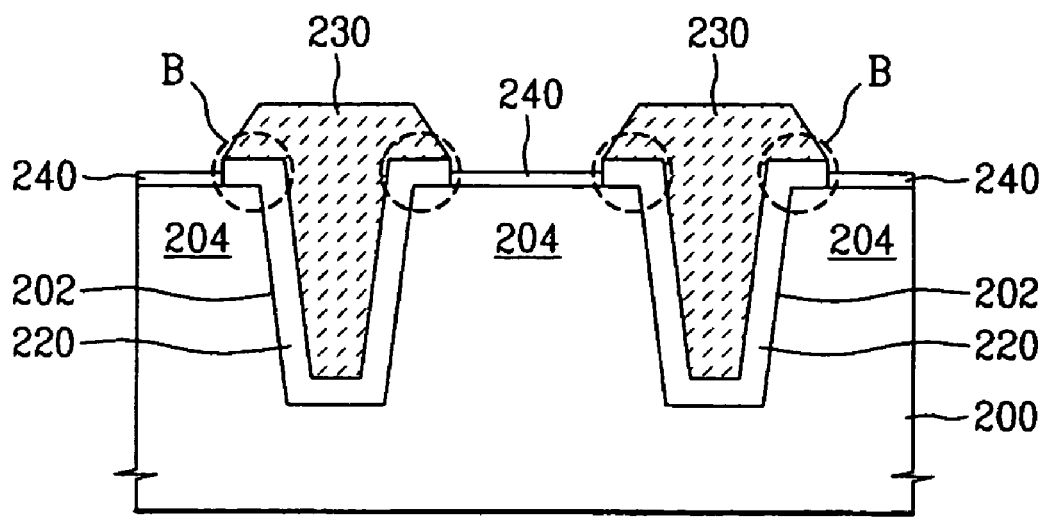

Referring to FIG. 5, oxidation is carried out on the substrate 200 to grow a sidewall oxide layer 220 100~300 Å thick. In doing so, the sidewall oxide layer 220 is formed on the exposed surface of the active area 204 as well as an inside of the trench 202. After forming the sidewall oxide layer 220, a nitride layer liner (not shown in the drawing) is formed thereon.

Subsequently, a high density plasma oxide layer 230 is formed over the substrate to fill up the trench 202.

Planarization is then carried out on the high density plasma oxide layer 230 until a topside of the nitride layer pattern 214 is exposed.

After the remaining nitride layer pattern 214 is fully removed by wet etch using a $H_3PO_4$ solution, the remaining pad oxide layer 212 is removed.

Finally, a trench isolation layer 230 is completed.

Meanwhile, in fabricating a flash memory device on the silicon substrate 200 having the trench isolation layer, a tunnel oxide layer 240 is formed on the active area 204. Yet, a thickness of the tunnel oxide layer 240 is generally thinner than that of the sidewall oxide layer 220. Hence, the relatively thicker sidewall oxide layer 220 is provided to the active area 204 on an edge B of the trench isolation layer 230, whereas the relatively thinner tunnel oxide layer 240 is provided to the rest of active area 204. As an electric field is intensively applied to the edge B of the trench isolation layer 230 by a bias applied for an erase operation, the electric field can be evenly distributed on the active area 204 overall. Specifically, the retention characteristic of storing data for a long time in a programmed mode can be enhanced.

Thereafter, in order to complete the flash memory device, a floating gate conductor layer pattern, a gate-to-gate insulating layer, a control gate, and the like are further provided to the silicon substrate 200 by a general flash memory device fabricating method.

Accordingly, in the present invention, the relatively thicker sidewall oxide layer is provided to the active area on the edge of the trench isolation layer, whereas the relatively thinner tunnel oxide layer is provided to the rest active area.

Therefore, the present invention enhances stability of the device and electrical characteristics such as retention and the like.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A trench isolation method in a flash memory device, comprising the steps of:
    forming a mask layer pattern on a mask layer pattern on a semiconductor substrate to expose a device isolation area but to cover an active area thereof, the mask layer pattern comprising a first insulating layer pattern and a second insulating layer pattern stacked thereon;
    forming a trench in the semiconductor substrate corresponding to the device isolation area;
    removing an exposed portion of the insulating layer pattern enough to expose a first portion of the semiconductor substrate in the active area adjacent to the trench;
    forming a sidewall oxide layer on an inside of the trench and the first exposed portion of the semiconductor substrate;
    filling up a trench with a third insulation layer to cover the sidewall oxide layer;
    removing the mask layer pattern to expose a second portion of the semiconductor substrate; and
    forming a tunnel oxide layer on the exposed second portion of the semiconductor substrate by laterally removing a portion of the first insulation layer to have a thickness less than a thickness of the sidewall oxide layer.

2. The trench isolation method of claim 1, wherein the first and second insulating layer patterns are formed of nitride and TEOS oxide, respectively.

3. The trench isolation method of claim 2, wherein the exposed portion of the first insulating layer pattern is removed by wet etch using $H_3PO_4$.

4. The trench isolation method of claim 1, wherein the exposed portion of the first insulating layer pattern is laterally removed to a thickness of 30~150 Å.

5. The trench isolation method of claim 1, wherein the sidewall oxide layer is formed 100~300 Å thick.

6. The trench isolation method of claim 1, wherein the third insulating layer is formed of high density plasma oxide.

7. The trench isolation method of claim 1, wherein removing the mask layer pattern comprises the steps of:
    planarizing the third insulating layer until a topside of the first insulating layer pattern is exposed; and
    removing the first insulating layer pattern.

8. The trench isolation method of claim 7, wherein the first insulating layer pattern is removed by wet etch.

* * * * *